(12) United States Patent
Chen et al.

(10) Patent No.: US 12,261,619 B2
(45) Date of Patent: Mar. 25, 2025

(54) STOCHASTIC ROUNDING SWITCHED CAPACITOR COMPUTATION CORES USEFUL FOR EFFICIENT DEEP LEARNING INFERENCE

(71) Applicant: International Business Machines Corporation, Armonk, NY (US)

(72) Inventors: Chia-Yu Chen, Westchester, NY (US); Ankur Agrawal, Chappaqua, NY (US); Andrea Fasoli, San Jose, CA (US); Kyu-hyoun Kim, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 18/085,094

(22) Filed: Dec. 20, 2022

(65) Prior Publication Data
US 2024/0204792 A1    Jun. 20, 2024

(51) Int. Cl.
*H03M 1/38* (2006.01)

(52) U.S. Cl.
CPC ................... *H03M 1/38* (2013.01)

(58) Field of Classification Search
CPC .............................. H03M 1/38; H03M 1/403
USPC ................................................ 341/161, 155
See application file for complete search history.

(56) References Cited

U.S. PATENT DOCUMENTS

| | | | |
|---|---|---|---|
| 7,978,117 B2 | 7/2011 | Jeon et al. | |
| 7,999,719 B2 | 8/2011 | Jeon et al. | |
| 8,847,811 B2 | 9/2014 | Wong et al. | |
| 9,059,730 B2 | 6/2015 | Park et al. | |
| 9,077,371 B2 | 7/2015 | Price et al. | |
| 10,033,395 B1 | 7/2018 | Vaz | |
| 2019/0305790 A1* | 10/2019 | Kinyua | H03M 1/164 |
| 2022/0075596 A1 | 3/2022 | Agrawal et al. | |
| 2022/0368341 A1* | 11/2022 | Fujimoto | H03M 1/164 |

OTHER PUBLICATIONS

Sr. Steve Arar, "Learn About SAR ADCs: Architecture, Applications, and Support Circuitry", All About Circuits, (Oct. 24, 2019), downloaded on Nov. 8, 2022 from https://www.allaboutcircuits.com/technical-articles/learn-about-sar-adcs-architecture-applications-support-circuitry/.
J. Lee, H. Valavi, and N. Verma, "Fully Row/Column-Parallel In-memory Computing SRAM Macro employing Capacitor-based Mixed-signal Computation with 5-b Inputs," IEEE VLSI Symp on Circuits (VLSIC), Jun. 2021.
H. Jia, M. Ozatay, Y. Tang, H. Valavi, R. Pathak, J. Lee, and N. Verma, "A Programmable Neural-Network Inference Accelerator Based on Scalable In-Memory Computing," Proc. Int'l Solid-State Circuits conf. (ISSCC), Feb. 2021, pp. 236-237.
H. Jia, M. Ozatay, Y. Tang, H. Valavi, R. Pathak, J. Lee, and N. Verma, "Scalable and Programmable Neural Network Inference Accelerator Based on In-Memory Computing," IEEE J. of Solid-State Circuits (JSSC), DOI: 10.1109/ISSCC42613.2021.9365788. (invited).

* cited by examiner

*Primary Examiner* — Peguy Jean Pierre
(74) *Attorney, Agent, or Firm* — Randy Tejeda (57) ABSTRACT

An apparatus includes multiple analog to digital converters. Individual analog to digital converters are configured to produce a digital output from an analog input and configured to compute a least significant bit of the digital output by comparing an internal residual voltage for determination of the least significant bit and a residual voltage from another analog to digital converter.

17 Claims, 11 Drawing Sheets

STOCHASTIC ROUNDING SWITCHED CAPACITOR COMPUTATION CORES USEFUL FOR EFFICIENT DEEP LEARNING INFERENCE

BACKGROUND

This invention relates generally to deep learning or other artificial intelligence systems and, more specifically, relates to stochastic rounding in these systems.

Some artificial intelligence systems implement neural networks, which have layers of nodes that take input data and pass it through the layers to create one or more outputs. For instance, a neural network could be trained to distinguish between pictures of cats and pictures of dogs, and have an output or outputs indicating whether an input picture has a cat or a dog.

More complex neural networks, e.g., having three or more layers with an input layer, hidden layers, and an output layer, are considered to perform deep learning. Such networks may have many layers and therefore have the ability to provide complex inferences from data sets. While neural networks are usually conceptualized as interconnected rows of nodes, the layers can be implemented as a matrix multiplication engine having individual unit computes that can perform, e.g., multiplication and/or convolution.

Within this system, quantization of weights and activation values may be performed to reduce the amount of data being processed, as well as to reduce the energy consumed in performing the computation. Quantization is the process of removing information in the least significant bits (LSBs) of a digital word. For example, a 16-bit word might be quantized to a 10-bit word simply by truncation of 6 LSBs. One common technique to perform quantization is nearest rounding, where the LSB of the output is rounded up (e.g., to one) or down (e.g., to zero) based on where the value represented by the truncated bits falls between zero and one. Another technique that has been shown to work better is stochastic rounding, which adds an element of randomness when performing rounding of the LSB of the output.

While stochastic rounding is beneficial, it adds a complexity to the system, as additional circuitry has to be added in order to perform the stochastic rounding, and this circuitry has to be added for individual unit computes or ensembles of unit computes.

SUMMARY

This section is meant to be exemplary and not meant to be limiting.

In an exemplary embodiment, an apparatus is disclosed that includes multiple analog to digital converters. Individual analog to digital converters are configured to produce a digital output from an analog input and configured to compute a least significant bit of the digital output by comparing an internal residual voltage for determination of the least significant bit and a residual voltage from another analog to digital converter.

Another exemplary embodiment is an apparatus, wherein the internal residue voltage is determined using a switched capacitor computation for the least significant bit.

A further exemplary embodiment is an apparatus, wherein an individual one of the multiple analog to digital converters as a source is configured to output its internal residual voltage to a single other analog to digital converter as a recipient. There is a mapping of the internal residual voltages between sources in the multiple analog to digital converters and recipients in the multiple analog to digital converters. For this apparatus, the outputted residual voltages for individual analog to digital converters may correspond to a voltage difference between a voltage created internally when determining the least significant bit and an input voltage corresponding to the analog input and being converted to the digital output when determining the least significant bit. Additionally for this apparatus, the internal residue voltage may be determined using a switched capacitor computation for the least significant bit.

Another exemplary embodiment is an apparatus wherein for a first (n−1) cycles, the analog to digital converters produced (n−1) bits of the corresponding digital outputs based on corresponding (n−1) digital bit computations. For the n'th cycle, the analog to digital converters are configured to compare their respective internal residual voltage and the residual voltage from their respective other analog to digital converters to determine the n'th bit that is the least significant bit of the digital output. For this apparatus, the residual voltage that is output to the other analog to digital converters may be a voltage difference between a voltage formed when determining the least significant bit for the computation at the n'th cycle and an input voltage corresponding to the analog input and being converted to the digital output when determining the least significant bit. This apparatus may also include where an individual analog to digital converter comprises:

a multiplexer having a first input coupled to the residual voltage from the other analog to digital converter and a second input coupled to a reference voltage, and an output;
 a comparator having a first input coupled to the output of the multiplexor, having a second input, and having an output;
 successive approximation register and latch circuitry having a first input coupled to the output of the comparator, and producing the digital output;
 a switched capacitor digital to analog converter having a plurality of capacitors used for the switched capacitor computation, having a single input coupled to a held input voltage and to the second input of the comparator, and having multiple inputs coupled to corresponding multiple ones of the plurality of capacitors, wherein the successive approximation register and latch circuitry creates different voltages for the computations of individual bits of the digital output using the multiple inputs;
 a controller, the controller causing the multiplexer to select the reference voltage for the first (n−1) cycles, and causing the multiplexor to select the residual voltage from the other analog to digital converter for the n'th cycle.

This apparatus may further include a deep learning accelerator comprising the multiple analog to digital converters having residual voltages coupled between individual ones of the multiple analog to digital converters. There is a mapping from an analog to digital converter outputting a residual voltage to an analog to digital converter having the output residual voltage as an input. The multiple analog to digital converters may be configured to perform computations in parallel. Alternatively, the multiple analog to digital converters may be configured to perform time-interleaving using the multiple analog to digital converters at an operating rate to produce individual outputs, wherein the apparatus further comprises a multiplexor that creates a single output from the individual outputs, and wherein the single output has a processing rate faster than the operating rate.

Another example has the apparatus where, for a first (n−1) cycles, the multiple analog to digital converters produced (n−1) bits of the output based on corresponding (n−1) digital bit computation, For the n'th cycle, the analog to digital converters are configured to compare their corresponding internal residual voltages added to the residual voltage from the other analog to digital converter to an input voltage from the analog input to determine the n'th bit that is the least significant bit of the digital output. This example can be extended, wherein the residual voltage that is output to the other analog to digital converter is a voltage difference between the input voltage and the residual voltage of a computation at the n'th cycle added to the residual voltage from the other analog to digital converter. Additionally, an individual analog to digital converter may include:

- a multiplexer having a first input coupled to the residual voltage from the other analog to digital converter and a second input coupled to a reference voltage, and an output;
- an adder having a first input coupled to the output of the multiplexer, having a second input, and having an output,
- a comparator having a first input coupled to the output of the adder, having a second input coupled to input voltage from the analog input and having an output;
- successive approximation register circuitry having a first input coupled to the output of the comparator, and producing the digital output;
- a digital to analog converter having a plurality of capacitors used for the switched capacitor computation, having an output coupled to the second inputs of the adder, having multiple inputs coupled to the digital output, and having multiple inputs coupled to corresponding multiple ones of the plurality of capacitors, wherein the successive approximation register and latch circuitry creates different voltages for the computations of individual bits of the digital output using the multiple inputs;
- a controller, the controller causing the multiplexer to select the reference voltage for the first (n−1) cycles, and causing the multiplexor to select the residual voltage from the other analog to digital converter for the n'th cycle.

This example may also include a deep learning accelerator comprising the multiple analog to digital converters having residual voltages coupled between individual ones of the multiple analog to digital converters. There is a mapping from an analog to digital converter outputting a residual voltage to an analog to digital converter having the output residual voltage as an input. This example may also include wherein the multiple ones of the analog to digital converters are configured to perform computations in parallel. Alternatively, the multiple analog to digital converters may be configured to perform time-interleaving using the multiple analog to digital converters at an operating rate to produce individual outputs, wherein the apparatus further comprises a multiplexor that creates a single output from the individual outputs, and wherein the single output has a processing rate faster than the operating rate.

BRIEF DESCRIPTION OF THE SEVERAL VIEWS OF THE DRAWINGS

FIG. 1, which spans FIGS. 1A, 1B, and 1C, illustrates replacing digital engines with switched-capacitor compute engines for AI architecture, where FIG. 1A illustrates purely digital AI architecture.

FIGS. 3A and 3B are graphs used to illustrate possible benefits of stochastic rounding, where

DETAILED DESCRIPTION

Abbreviations that may be found in the specification and/or the drawing figures are defined below, at the end of the detailed description section.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

There are problems that can be addressed in deep learning inference implemented with AI architecture. These problems are described now.

Figures 1, 1A:
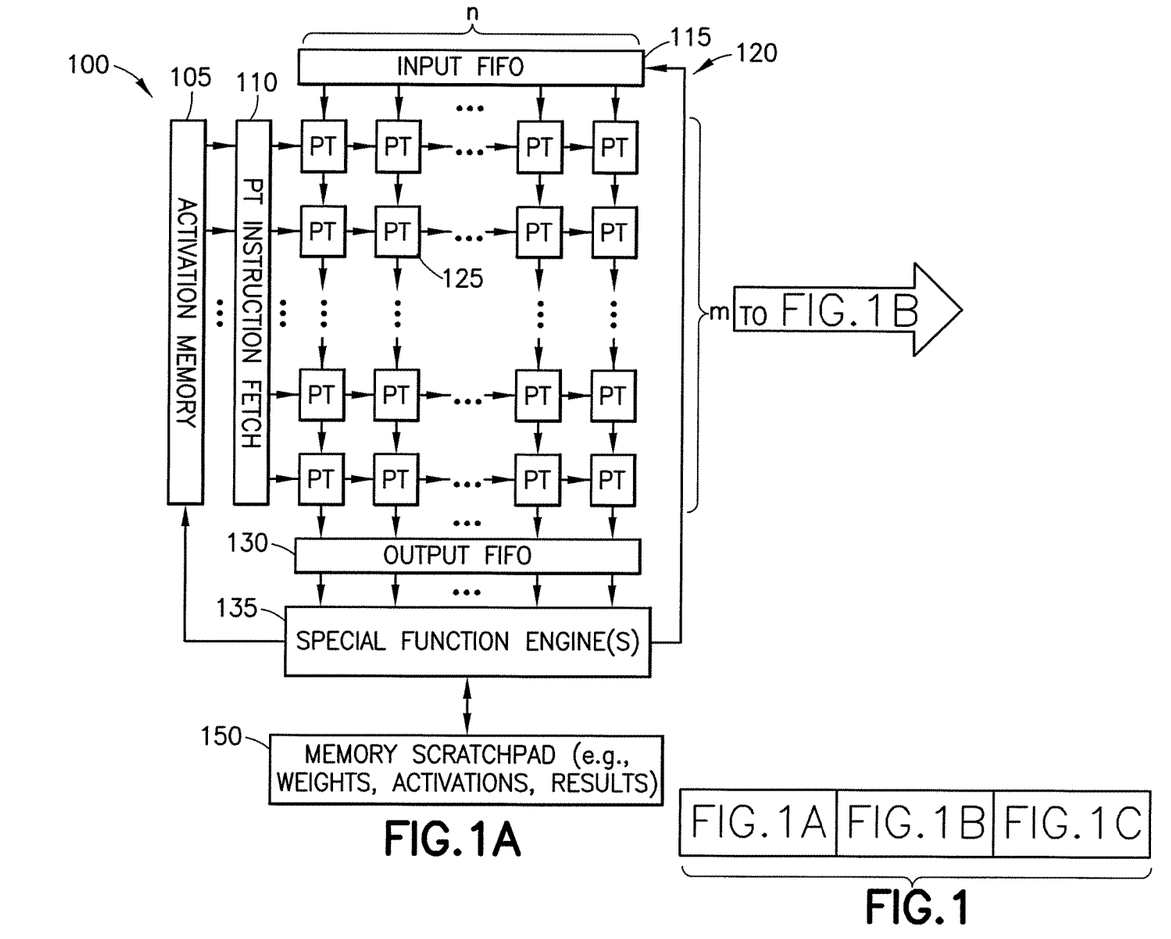
Figure 1B:
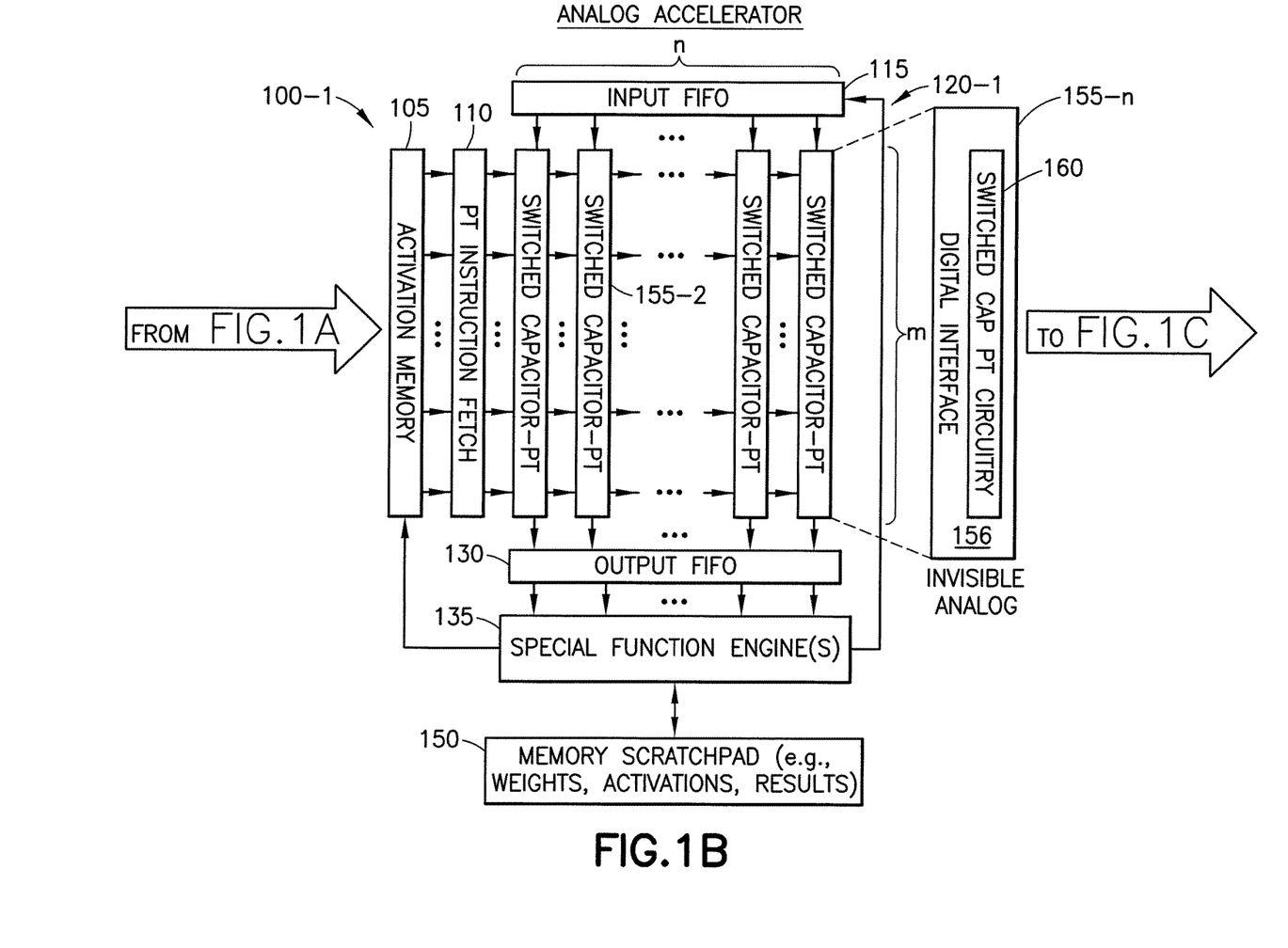
FIG. 1B illustrates an AI architecture (e.g., a deep learning accelerator) that uses an analog accelerator, and FIG. 1 C illustrates switched capacitor PT circuitry.
Figure 1C:
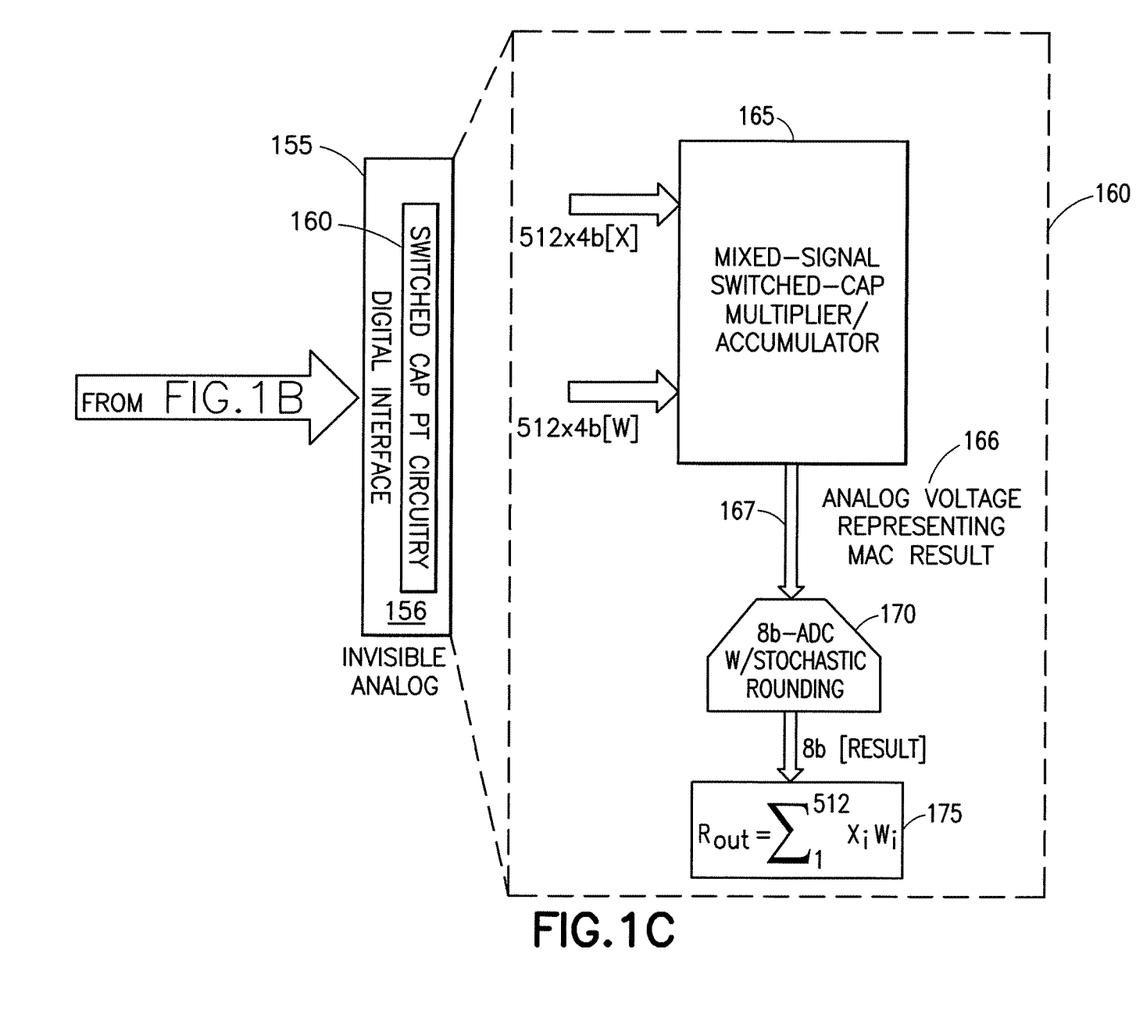

Turning to FIG. 1, which spans FIGS. 1A, 1B, and 1C, this figure illustrates replacing digital engines with switched-capacitor compute engines for AI architecture. FIG. 1A illustrates a purely digital AI architecture, FIG. 1B illustrates an AI architecture that uses an analog accelerator, and FIG. 1C illustrates switched capacitor PT circuitry.

In FIG. 1A, an exemplary AI architecture 100 is illustrated having an activation memory 105, a PT instruction fetch 110, an input FIFO 115, a matrix multiplication engine 120, an output FIFO 130, one or more special function engines 135, and a memory scratchpad 150. The matrix multiplication engine 120 includes m rows and n columns of individual PTs 125, to form a PT array. The activation memory 105 is a last-level scratchpad, which is used to stage the activations going into the PT array. This is an activation memory in the context of AI accelerators. Activations are the inputs to the layers of the neural network. So, for the first layer of the network, activations are the input data on which training or inferencing is run. For the subsequent layers, activations are the output of the previous layers. The PTs are processing tiles, which are a part of the systolic array of tiles, and which are used to perform matrix multiplication and convolutions. The memory scratchpad 150 is used to stage data (e.g., weights, activations, results) into and out of the core, which includes the activation memory 105 (e.g., for training or inferencing data) and the input FIFO 115 (e.g., for weights including updated weights).

The individual PTs 125 perform multiplications, e.g., to multiply data by weights. For NN applications such as for deep learning, the input FIFO 115 can be considered to supply weights and the activation memory 105 can be considered to supply data for training or inferencing. The special functions engine(s) 135 may perform computations such as outer-loop accumulations, batch normalization and non-linear functions in higher numerical precision, as dictated by the workload needs to preserve the overall accuracy of the AI system. The AI architecture 100 separates 2D low-precision computes from 1D high-precision computes.

Each column of the PT 2D m×n array for the matrix multiplication engine 120 and performed in digital can be replaced by a Switched Capacitor-PT (SC-PT) unit. This is illustrated in FIG. 1B, where each column now has an SC-PT unit 155, with n of these. FIG. 1B can be considered to be a deep learning accelerator, and shows an example where there are multiple analog to digital converters are configured to perform computations in parallel. Each SC-PT unit 155 includes a digital interface 156 to switched cap (capacitor) circuitry 160. Inputs and outputs of the SC-PT unit 155 are all digital, and the SC-PT unit implementation in FIG. 1B is functionally identical (with minor dataflow modifications) to the implementation in FIG. 1A. The replacement of a column of PTs 121 with an SC-PT unit 155 may include benefits such as reduced power consumed for matrix multiplication and/or convolution operations and improved speed. The switched cap PT circuitry may be referred to as "invisible analog", because the digital interface 156 provides digital inputs and outputs and can appear as a column of PTs 120. This switched-capacitor based CMOS-compatible analog circuitry 160 exploits analog accumulations and therefore the AI architecture 100-1 can be considered to implement an analog accelerator, and in particular a deep learning accelerator.

FIG. 1C illustrates an example of the switched cap PT circuitry 160, which has a mixed-signal switched cap multiplier/accumulator 165. The mixed-signal switched cap multiplier/accumulator 165 has inputs of 512 by ("x") 4 bits (b) of data (X, from the activation memory 105) and 512 by 4b of weights (W, from the memory scratchpad 150 via the input FIFO 115) and produces an analog voltage 166 representing the multiply-accumulate (MAC) result (represented by the arrow 167). An 8 bit (8b) ADC 170 converts this to digital and implements stochastic rounding. The output of the ADC is an 8b result, quantized with stochastic rounding technique, corresponding to the following equation (reference 175):

$$R_{out} = \Sigma_1^{512} X_i W_i.$$

Figure 2:
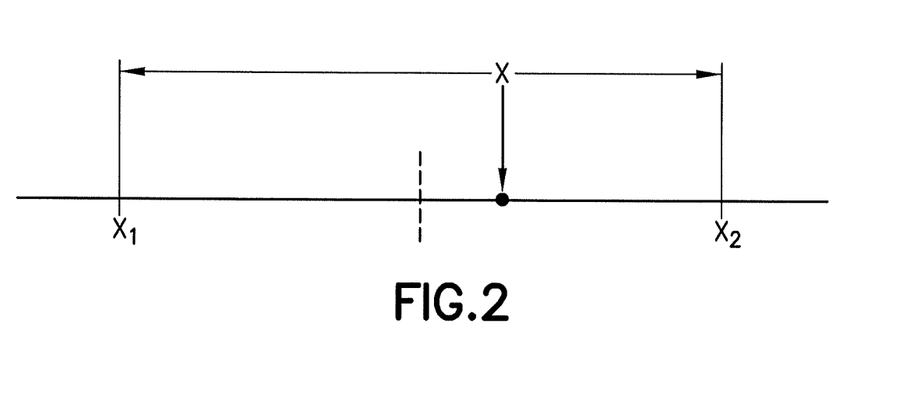
FIG. 2 is an example of a number line used to explain stochastic rounding.

Concerning the stochastic rounding, FIG. 2 is an example of a number line used to explain stochastic rounding. The function sround $(x)=x_1$ with probability $|x-x_1|/|x_1-x_2|$ or sround $(x)=x_2$ with probability $|x-x_2|/|x_1-x_2|$. This scheme is unbiased and useful in applications where one is performing (e.g., aggressive) quantization and processing a large ensemble of values. Aggressive quantization is quantization by a large amount. Going from 16b-bit words to 14-bit words is not aggressive, but going from 16-bit words to 4-bit words is, as an example. In particular, stochastic rounding has proven to be an effective technique in quantized deep learning networks.

There are many ways to implement stochastic rounding, including the following:
(a) Instead of using $0.5*|x_1-x_2|$ as the threshold (nearest rounding), use a uniformly distributed random number between $x_1$ and $x_2$.
(b) Add a uniformly distributed random number between $x_1$ and $x_2$ to x, and then truncate the result.

The examples provided below use (a) above, but are not limited to this.

Figure 3A:
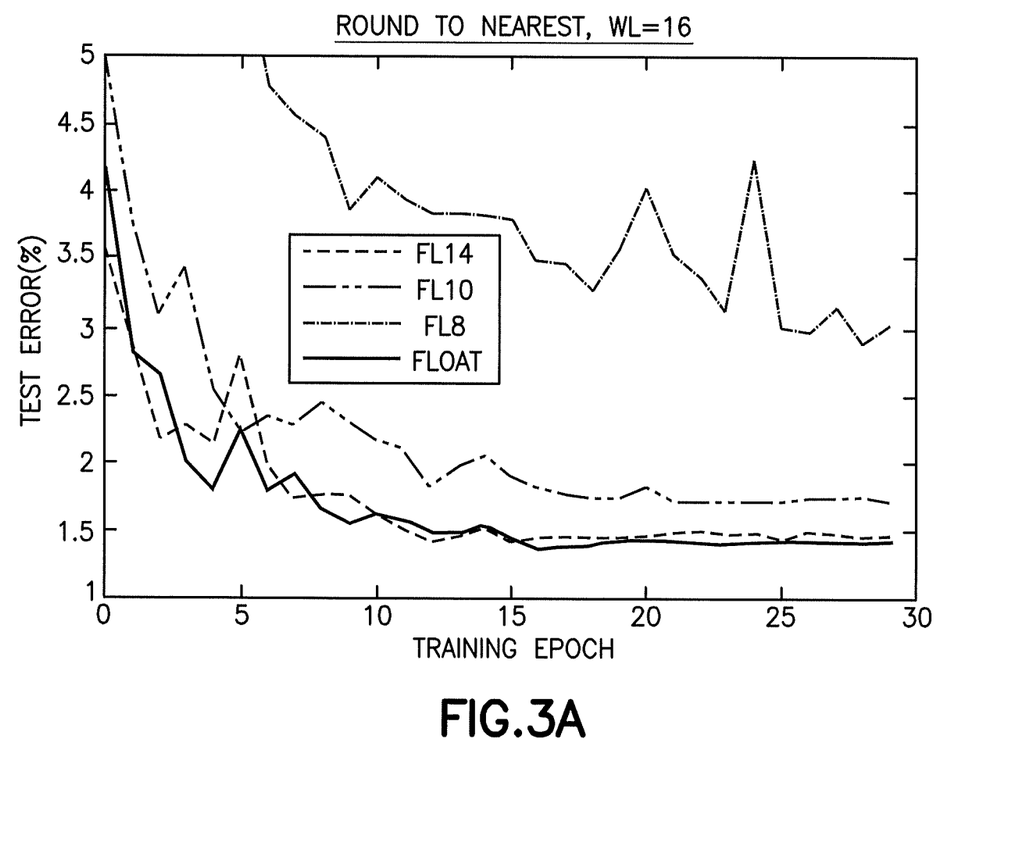
FIG. 3A illustrates a round to nearest technique and FIG. 3B illustrates a stochastic rounding technique.
Figure 3B:
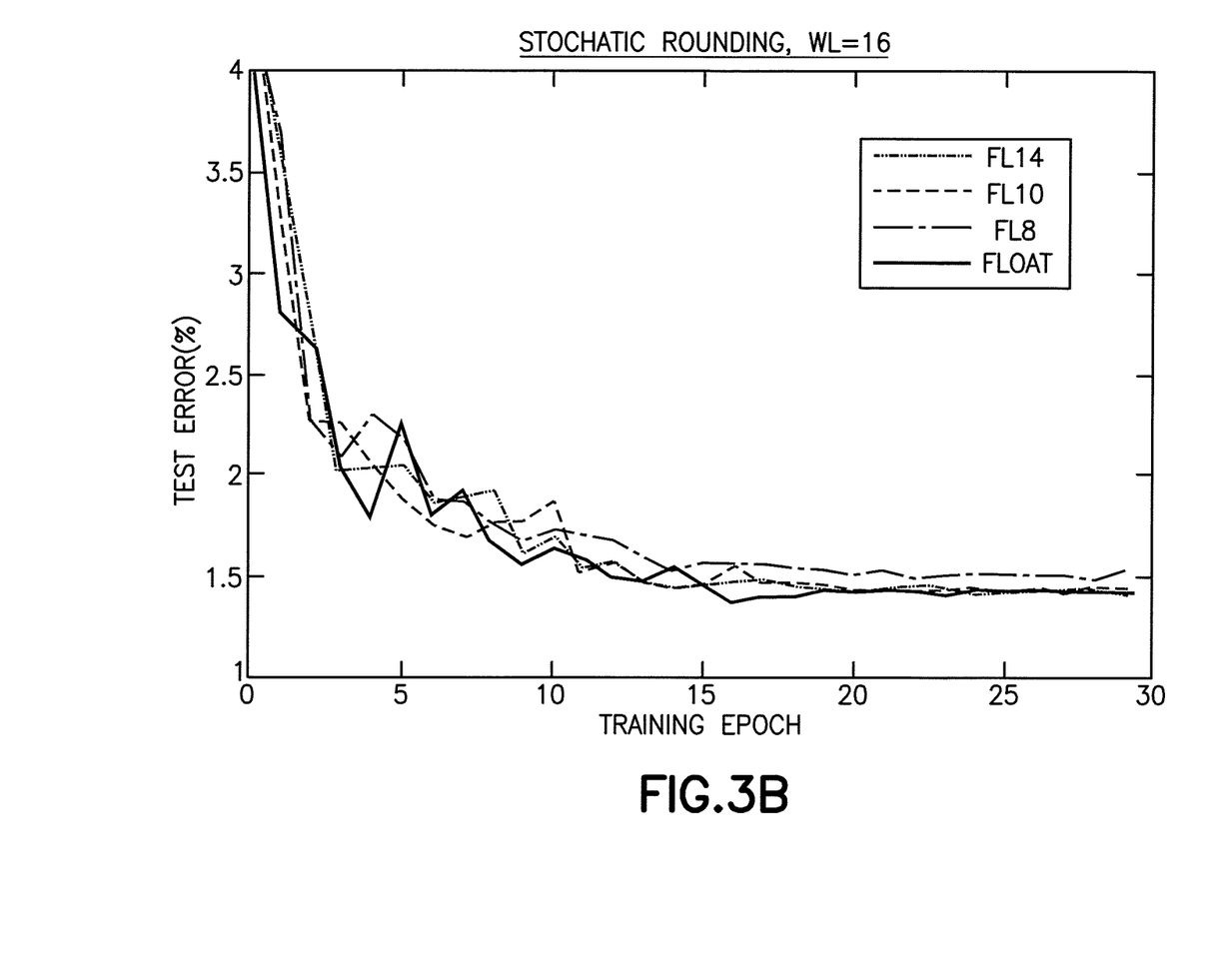

In more detail, stochastic rounding (such as performed by the ADC 170 in FIG. 1C) numerically keeps more information of LSB truncation areas, compared to the nearest rounding. That is, stochastic rounding shows more robust NN accuracy. Consider FIGS. 3A and 3B, which are graphs used to illustrate possible benefits of stochastic rounding, where FIG. 3A illustrates a round to nearest technique and FIG. 3B illustrates a stochastic rounding technique. These show the training curve (training loss versus training epoch) for a network trained using INT16 precision, but assuming that the implied decimal point is at different locations for the different curves. In particular, FL denotes the number of fractional bits remaining out of the total 16 available bits (the word length, WL), as compared to floating point (float) without rounding. It can be seen that the stochastic rounding has a significant improvement relative to the round to nearest technique for more aggressive quantization (in terms of aggressiveness: FL 8>FL10>FL14>float).

The inventors have realized that, from an algorithms perspective, stochastic rounding helps in DL inference. The exemplary embodiments below provide stochastic rounding with limited additional structure. In particular, an array of ADCs is disclosed that produces stochastically rounded outputs by having the individual ADCs collaborate with each other.

Figure 4:
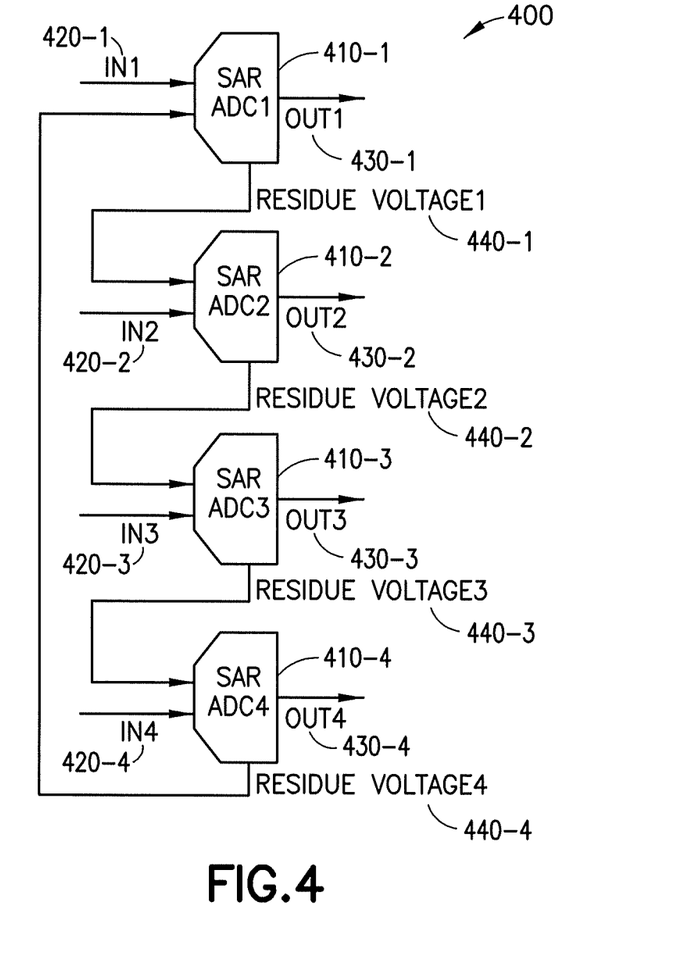
FIG. 4 illustrates how an ADC can be implemented as a SAR ADC with stochastic rounding.

There are multiple techniques for implementing ADCs. One such example is presented in FIG. 4, which illustrates how an ensemble (e.g., array) 400 of ADCs can be implemented as SAR ADCs with stochastic rounding. Shown here for an ensemble 400 of four ADCs, but can be generalized to any ensemble of size greater than or equal to two ADCs. The ensemble 400 could be used as the ADC 170 in FIG. 2, for instance. There is an ensemble (e.g., array) 400 of four SAR ADCs 410-1, 410-2, 410-3, and 410-4, each of which has a corresponding input 420-1, 420-2, 420-3, and 420-4 and output 430-1, 430-2, 430-3, and 430-4. Each of the SAR ADCs 410 has a corresponding residual voltage 440-1, 440-2, 440-3, or 440-4 that is routed to a neighbor of the SAR ADCs 410: residual voltage 440-1 is routed from SAR ADC 410-1 to neighbor SAR ADC 410-2; residual voltage 440-2 is routed from SAR ADC 410-2 to neighbor SAR ADC 410-3; residual voltage 440-3 is routed from SAR ADC 410-3 to neighbor SAR ADC 440-4; and residual voltage 440-4 is routed from SAR ADC 410-4 to neighbor SAR ADC 410-1. FIG. 4 illustrates an array of ADCs 410 that produces stochastically rounded outputs by having the individual ADCs 410 collaborate (using the residual voltages 440) with each other. Furthermore, these can be implemented in FIGS. 1B and 1C (e.g., as ADC 170 with stochastic rounding) and is an example (for FIGS. 1B, 1C and 4) where there are multiple analog to digital converters that are configured to perform computations in parallel.

Figure 5:
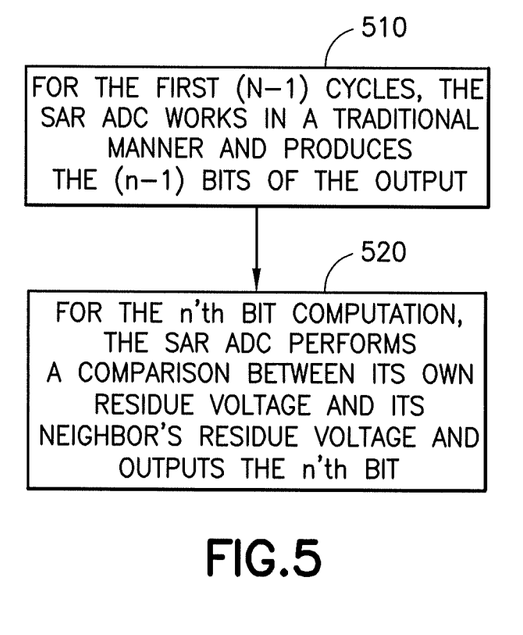
FIG. 5 is a flowchart of a method for using residual voltage in SAR ADCs from FIG. 4.

It can be assumed that the ADC outputs are n-bit. FIG. 5 is a flowchart of a method for using residual voltage in SAR ADCs 410 from FIG. 4. As block 510 indicates, for the first (n−1) cycles, a SAR ADCs 410 works in a traditional manner and produces the (n−1) bits of the output 430 based on the input 420. As block 520 indicates, for the n'th bit computation, a SAR ADC 410 performs a comparison between its own internal residue voltage and the neighbor's residue voltage and outputs the n'th bit based on this comparison. The neighbor's residue voltage can be thought of as a random value that the ADCs own internal residue is compared against. An example of the internal residue voltage is described below. It is noted that the terms "residue voltage" and "residual voltage" are assumed to have the same meaning herein.

It is noted that sending the residue voltage between neighbors is just one exemplary chosen routing scheme, but is not intended to be limiting. Instead, any configuration with some predetermined (e.g., 1:1) mapping between ADCs (e.g., essentially a routing table to send the residual values) may be used. Each ADC routes residual voltage to one other ADC in the ensemble, and all ADCs receive residual voltage from another ADC.

Figure 6:
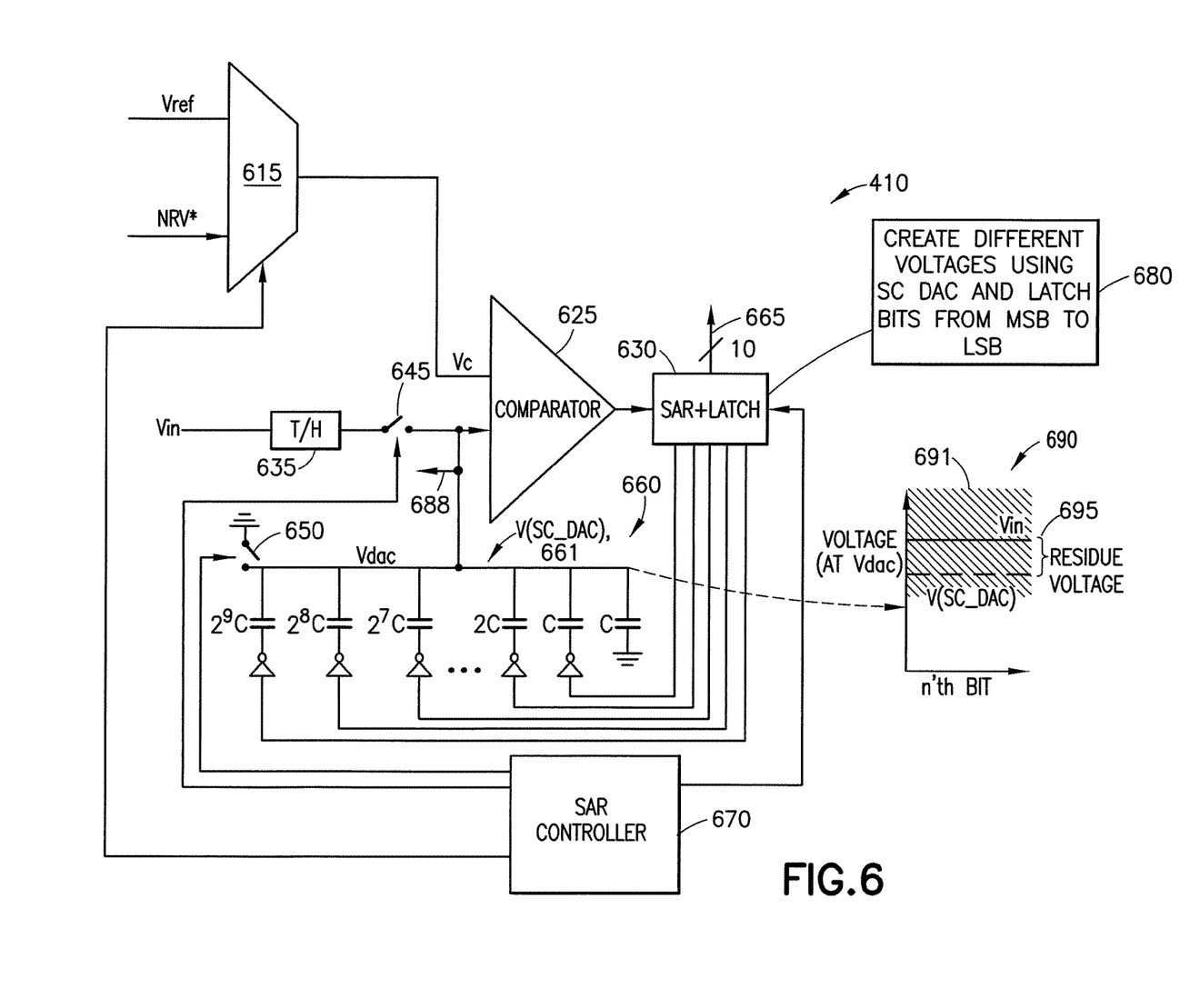
FIG. 6 is an example of circuitry in one of the SAR ADCs in FIG. 4.

Referring to FIG. 6, this figure is an example of circuitry in one of the SAR ADCs 410 in FIG. 4. The SAR ADC 410 includes a multiplexer (MUX) 615, track and hold (T/H) circuitry 635, a comparator 625, SAR and latch circuitry 630, an SC DAC 660, a SAR controller 670, and two switches 645, 650. For a conventional system, the Vref would be input to the comparator 625 and the SAR controller 670 and MUX 625 would not be used.

However, starting with a regular SAR ADC, modifications are introduced including the SAR controller 670 and the MUX 615. That is, while all SAR ADCs have a controller to orchestrate the multi-step conversion process, the SAR controller 670 herein has additional responsibilities, since it also needs to send the select signal to the MUX 615. The SAR controller 670 also helps to implement the method in FIG. 5. That is, for the first (n−1) comparisons, Vc=Vref and the SAR controller 670 sets the MUX 615 accordingly. See block 510 of FIG. 5. During this time, the SAR and latch circuitry 665 creates (see block 680) multiple voltages as inputs (V(SC_DAC)) to create Vdac, which is equal to Vin−V(SC_DAC). V(SC_DAC) 661 is the voltage that would exist at the output of the SC-DAC if V(SC_DAC) 661 was not connected to Vin in this fashion (that is, the switch 645 was open and not coupling Vin to Vdac). In other words, V(SC_DAC) 661 is the amount of perturbation to the Vin voltage. Thus Vdac=Vin−(this perturbation).

The SAR+latch 630 controls the SC DAC 660, which includes a set of capacitors with values ranging from C to $2^0$ C., in order to create the perturbation that is the V(SC_DAC). In general, the SAR and latch circuitry compares the Vdac (as Vin−V(SC_DAC)) with Vc to create and latch bits from the MSB to the LSB. For operation where Vref is being used, this creates the most significant nine bits of the 10 bits of output 665. Operation of the SC DAC 660 and the SAR and latch circuitry 630 is known to those skilled in this area. For instance, different combinations of capacitors can be selected to create different voltages used as the perturbation that is the V(SC_DAC) 661.

For the n'th comparison, Vc=NRV, which is the residual voltage from the neighbor SAR ADC 415. This causes a comparison between the NRV and the residue voltage of the ADC 410 (see block 520 of FIG. 5 too).

As an example of residue voltage, consider the graph 690, which illustrates the voltage on Vdac for the n'th bit. Vin has been latched by the T/H circuitry 635, and the voltage V(SC_DAC) 691 that has been formed by the SAR and latch circuitry 630 using the SC DAC 660. In this example, the V(SC_DAC) 691 has a voltage beneath Vin. The difference in Vin and V(SC_DAC) is the internal residue voltage 695 (and also the Vdac), which is internal to this ADC 410. Reference 691 indicates an exemplary range over which the residue voltage might fall, and illustrates a region in which V(SC_DAC) might fall. Therefore, the residue voltage 695 has an element of randomness.

Note that for this example, Vdac is coupled to the neighboring ADC as a residue voltage. This is illustrated by reference 688, which could be a single line output to a neighbor SAR ADC 415. Note that the coupling could include amplification, latching, a switch to gate when the signal is sent (e.g., at the end of the (n−1)th cycle), or the like, if desired.

The SAR and latch circuitry 630 uses the comparison between NRV and the internal residue voltage 695 to create the LSB in the output 665, which is the n'th, the least significant, and tenth bit of the 10 output bits 665 in this example.

The SAR controller 670 controls the switch 650 to connect the upper plates of the capacitors in the SC DAC 660 to ground, e.g., to pre-set a charge on the capacitors using the latched Vin and then to remove the connection to ground during sampling operations. The SAR controller 670 also controls the switch 645 to connect the tracked and held Vin to the comparator 625 and to the SC DAC 660, or, e.g., reset the system by opening the switch 645 and closing the switch 650 so the system is connected to ground. The SAR and latch circuitry 630 has a bank of n latches and some logic. The SAR controller 670 controls what values get written to which latches at every time step to enable the SAR (e.g., binary search) algorithm.

Figure 7:
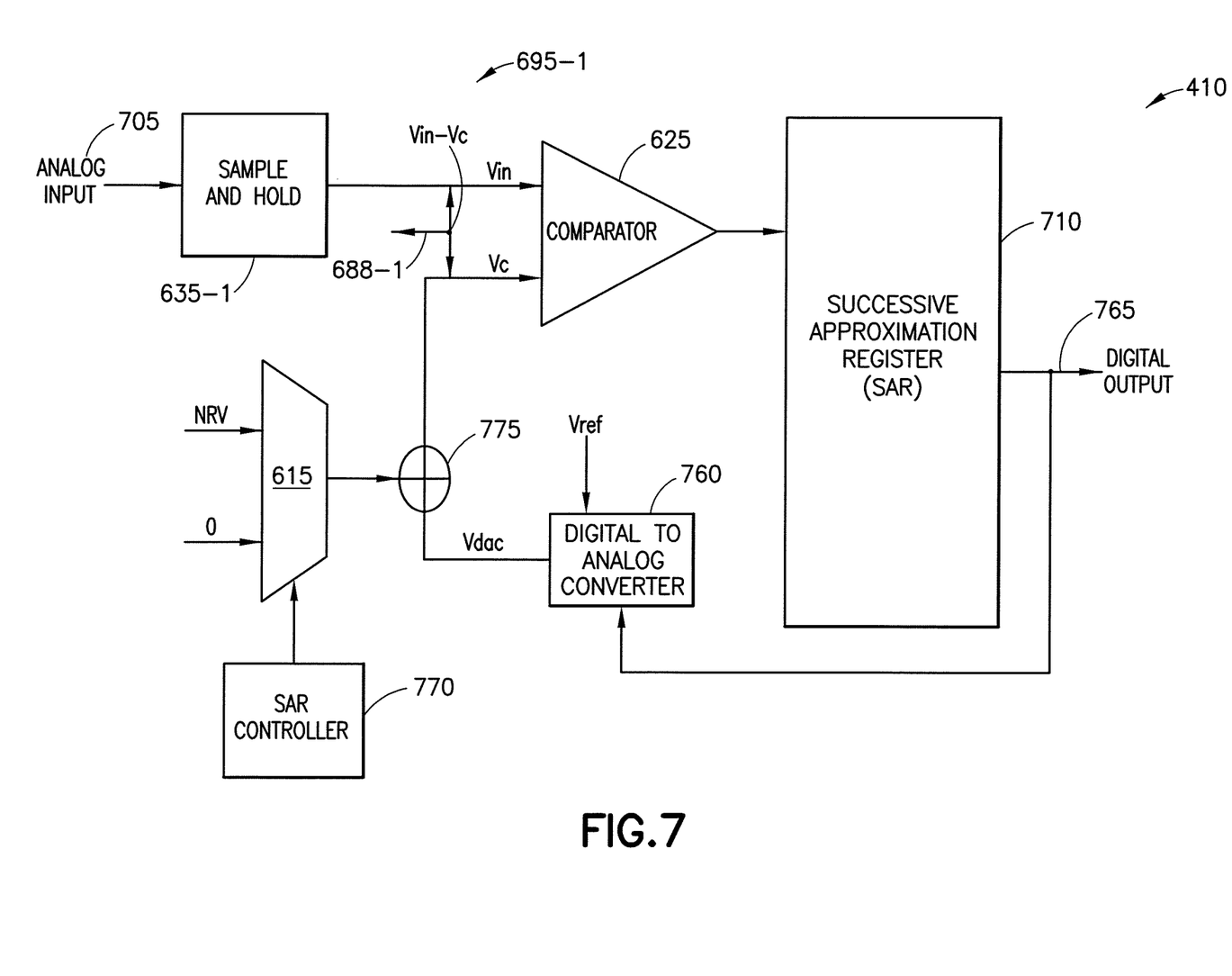
FIG. 7 is another example of possible circuitry in one of the SAR ADCs in FIG. 4.

Turning to FIG. 7, this figure is another example of possible circuitry in one of the SAR ADCs in FIG. 4. This example has an analog input 705 being input into sample and hold circuitry 635-1, which is considered to be a version of the T/H 635 of FIG. 6. The output Vin of the sample and hold circuitry 635-1 is one input to the comparator 625, which creates an output to the SAR 710, which forms a digital output 765 (similar to the output 665 of FIG. 6). Digital output 765 is coupled (along with reference voltage Vref) to the digital to analog converter 760, which produces an output that is coupled to the adder 775. The output (Vc) of the adder 775 is coupled to a second input of the comparator 625. The MUX 615 has the NRV and a "zero" (0) as inputs. One could say that "0" is ground voltage. The MUX 615 has an output but it is held to the ground voltage to enable no relative change to Vdac. In practical embodiments, these circuits might be differential circuits, where every voltage (Vin, Vdac, Vc, and the like) is the difference of two absolute voltage levels carried on two wires, so it is easy to obtain a "0". But for simplicity, "0" is used as a ground voltage in this example. The SAR controller 770 controls the MUX 615. Not shown explicitly, but the SAR controller 770 in this figure also controls the SAR latches in the SAR 710 and the timing of the sample/hold circuit 635-1

Figure 8:
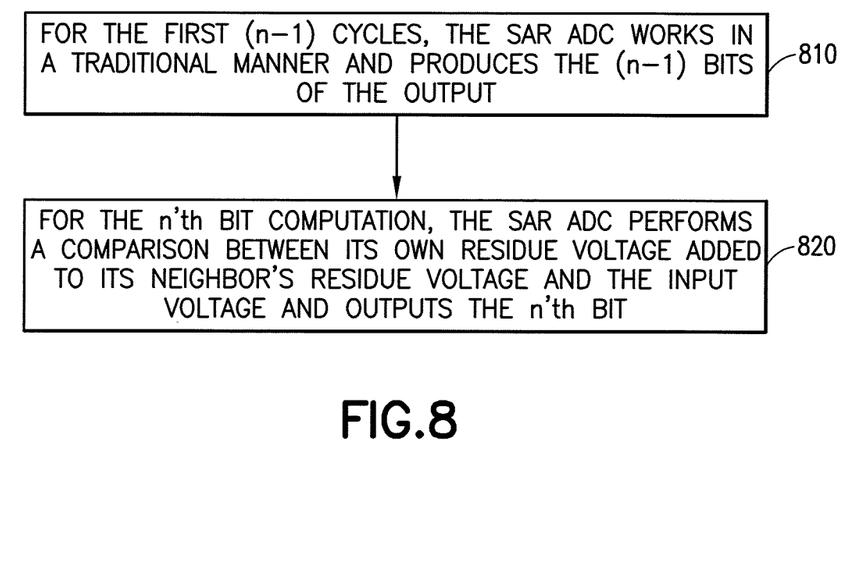
FIG. 8 is a flowchart of a method for using residual voltage in SAR ADCs from FIG. 7.

Starting with a regular SAR-ADC, modifications are introduced including the SAR controller 770, the MUX 615, and the adder 775. See also FIG. 8, which is a flowchart of a method for using residual voltage in SAR ADCs from FIG. 7. For the first (n−1) comparisons (one comparison performed per cycle), Vc=Vdac. See block 810 of FIG. 8. For the n'th comparison, Vc=Vdac+NRV. This is a comparison between the Vin and a combination of NRV from the neighbor and the current SAR ADCs 410. See block 820 of FIG. 8.

In this example, the internal residue voltage 695-1 is coupled to neighbor SAR ADC 410 as Vin−Vc, where Vc=NRV+Vdac (which is the residue voltage 691 of FIG. 6 as an example), e.g., coupled at the end of (n−1)th cycle. This coupling is illustrated by 688-1. Note that the coupling could include amplification, latching, a switch to gate when the signal is sent, or the like, if desired. Also, the timing could be at the end of the (n−1)th cycle, at the beginning of the n'th cycle, or any other time that is suitable.

While it is assumed above that ensembles of ADCs are used, this may not always be the case. If each unit compute (e.g., switched capacitor PT circuitry 160 in FIG. 1B or 1C) employs only 1 ADC, the SIMD lanes of compute may be used, since each SIMD lane will have distinct (uncorrelated results) to digitize at the end. Some AI architectures, for example, have 8-64 SIMD lanes.

Furthermore, some AI architectures use multiple ADCs within each unit compute. For example, to improve power efficiency and throughput of the unit compute engine, one could implement a time-interleaved ADC. Time interleaving is a technique that allows the use of multiple identical ADCs to process incoming data at a faster rate than the operating sample rate of each individual ADC. As an illustrative example, a time-interleaved ADC processing data at 100 MHz might be composed of 4 identical ADCs processing data at 25 MHz. In such arrangements, it is possible to use the multiple ADCs within each unit compute to provide NRV to each other.

Figure 9:
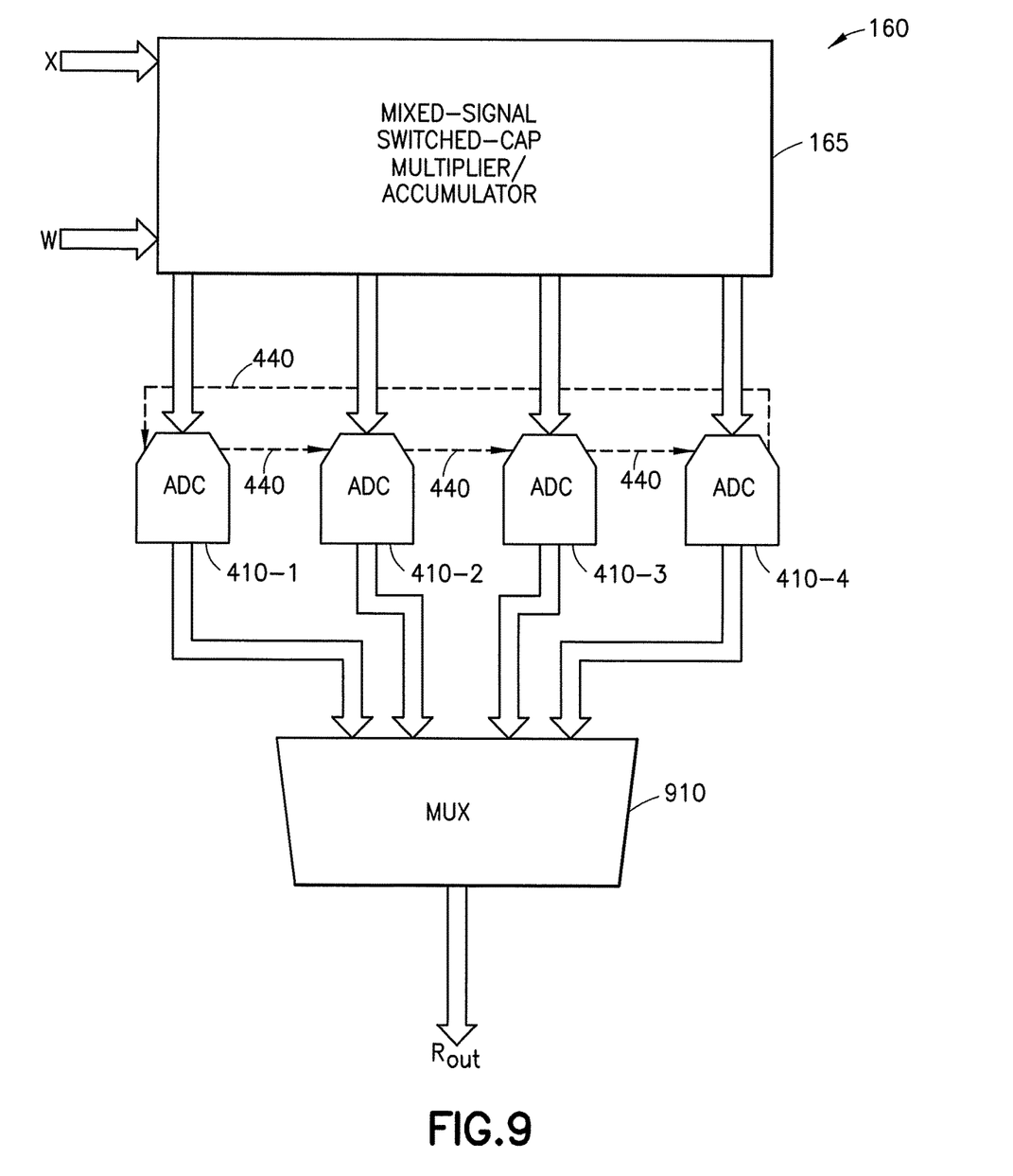
FIG. 9 is an example of switched cap (capacitor) circuitry 160 using time-interleaved ADC.

Referring to FIG. 9, this is an example of switched cap (capacitor) circuitry 160 using time-interleaved ADC. This is similar to FIG. 1C. There is a mixed-signal switched cap multiplier/accumulator 165 that takes in data (X) and weights (W) and produces four outputs to four ADCs 410-1, 410-2, 410-3, and 410-4. Each of these produces an NRV 440 that is routed to one other ADC. This example uses the neighbor routing, but other routing may be used (e.g., the NRV 440 from ADC 440-1 could be routed to ADC 410-3, and the like, with a predetermined routing between individual ADCs). The outputs of the ADCs 410 are output to the MUX 910, which produces the output $R_{out}$. This illustrates 4 identical ADCs processing data at 25 MHz to form a time-interleaved ADC processing data at 100 MHz.

What has been shown include a method and apparatus to utilize stochastic rounding within DL inference to improve the inference accuracy in highly quantized network implementations. This can be performed using limited additional structure.

As another example, what has been shown in a system/method to enable SAR-ADCs to produce a digital result with stochastic rounding, in which a SAR-ADC utilizes the residue voltage of a neighboring ADC as the reference voltage for its LSB computation, and incorporates a multiplexer to select between a reference voltage (e.g., traditional operation) and neighbor's residue voltage (e.g., stochastic bit computation).

Furthermore, it is possible to have a multitude of SAR-ADCs, and in a DL accelerator, it is possible to have multiple SAR-ADCs either when many computations are performed in parallel (commonly done), or if each multiply-accumulate operation is split over multiple ADCs.

While SARs are mainly described above, it is also to perform this function using parallel approximations instead of serial approximations. The techniques described above should work here too.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following abbreviations that may be found in the specification and/or the drawing figures are defined as follows:
1D one-dimension(al)
2D two-dimension(al)
ADC analog to digital converter
AI artificial intelligence
b bits
cap capacitor
CMOS complementary metal oxide semiconductor
DAC digital to analog converter
DL deep learning
FIFO first in, first out
LSB least significant bit
MAC multiply accumulate
mul-acc multiply accumulate
MUX multiplexer
NN neural network
NRV neighbor's residue voltage
PT processing tile
SAR successive approximation register
SC switched capacitor
SIMD single instruction, multiple data
T/H track and hold

What is claimed is:

1. An apparatus, comprising:
multiple analog to digital converters, wherein individual analog to digital converters are configured to produce a digital output from an analog input and configured to compute a least significant bit of the digital output by comparing an internal residual voltage for determination of the least significant bit and a residual voltage from another analog to digital converter.

2. The apparatus according to claim 1, wherein the internal residue voltage is determined using a switched capacitor computation for the least significant bit.

3. The apparatus according to claim 1, wherein an individual one of the multiple analog to digital converters as a source is configured to output its internal residual voltage to a single other analog to digital converter as a recipient, wherein there is a mapping of the internal residual voltages between sources in the multiple analog to digital converters and recipients in the multiple analog to digital converters.

4. The apparatus according to claim 3, wherein the outputted residual voltages for individual analog to digital converters correspond to a voltage difference between a voltage created internally when determining the least significant bit and an input voltage corresponding to the analog input and being converted to the digital output when determining the least significant bit.

5. The apparatus according to claim 4, wherein the internal residue voltage is determined using a switched capacitor computation for the least significant bit.

6. The apparatus according to claim 1, wherein for a first (n−1) cycles, the analog to digital converters produced (n−1) bits of the corresponding digital outputs based on corresponding (n−1) digital bit computations, and wherein for the n'th cycle, the analog to digital converters are configured to compare their respective internal residual voltage and the residual voltage from their respective other analog to digital converters to determine the n'th bit that is the least significant bit of the digital output.

7. The apparatus according to claim 6, wherein the residual voltage that is output to the other analog to digital converters is a voltage difference between a voltage formed when determining the least significant bit for the computation at the n'th cycle and an input voltage corresponding to the analog input and being converted to the digital output when determining the least significant bit.

8. The apparatus according to claim 6, wherein an individual analog to digital converter comprises:
a multiplexer having a first input coupled to the residual voltage from the other analog to digital converter and a second input coupled to a reference voltage, and an output;
a comparator having a first input coupled to the output of the multiplexor, having a second input, and having an output;
successive approximation register and latch circuitry having a first input coupled to the output of the comparator, and producing the digital output;
a switched capacitor digital to analog converter having a plurality of capacitors used for the switched capacitor computation, having a single input coupled to a held input voltage and to the second input of the comparator, and having multiple inputs coupled to corresponding multiple ones of the plurality of capacitors, wherein the successive approximation register and latch circuitry creates different voltages for the computations of individual bits of the digital output using the multiple inputs;
a controller, the controller causing the multiplexer to select the reference voltage for the first (n−1) cycles, and causing the multiplexor to select the residual voltage from the other analog to digital converter for the n'th cycle.

9. The apparatus according to claim 8, further comprising:
a deep learning accelerator comprising the multiple analog to digital converters having residual voltages coupled between individual ones of the multiple analog to digital converters, wherein there is a mapping from an analog to digital converter outputting a residual voltage to an analog to digital converter having the output residual voltage as an input.

10. The apparatus according to claim 1, wherein the multiple analog to digital converters are configured to perform computations in parallel.

11. The apparatus according to claim 10, wherein the multiple analog to digital converters are configured to perform time-interleaving using the multiple analog to digital converters at an operating rate to produce individual outputs, wherein the apparatus further comprises a multiplexor that creates a single output from the individual outputs, and wherein the single output has a processing rate faster than the operating rate.

12. The apparatus according to claim 1, wherein for a first (n−1) cycles, the multiple analog to digital converters produced (n−1) bits of the output based on corresponding (n−1) digital bit computations, and wherein for the n'th cycle, the analog to digital converters are configured to compare their corresponding internal residual voltages added to the residual voltage from the other analog to digital converter to an input voltage from the analog input to determine the n'th bit that is the least significant bit of the digital output.

13. The apparatus according to claim 12, wherein the residual voltage that is output to the other analog to digital converter is a voltage difference between the input voltage and the residual voltage of a computation at the n'th cycle added to the residual voltage from the other analog to digital converter.

14. The apparatus according to claim 12, wherein an individual analog to digital converter comprises:
a multiplexer having a first input coupled to the residual voltage from the other analog to digital converter and a second input coupled to a reference voltage, and an output;
an adder having a first input coupled to the output of the multiplexer, having a second input, and having an output,
a comparator having a first input coupled to the output of the adder, having a second input coupled to input voltage from the analog input and having an output;
successive approximation register circuitry having a first input coupled to the output of the comparator, and producing the digital output;
a digital to analog converter having a plurality of capacitors used for the switched capacitor computation, having an output coupled to the second inputs of the adder, having multiple inputs coupled to the digital output, and having multiple inputs coupled to corresponding multiple ones of the plurality of capacitors, wherein the successive approximation register and latch circuitry creates different voltages for the computations of individual bits of the digital output using the multiple inputs;
a controller, the controller causing the multiplexer to select the reference voltage for the first (n−1) cycles, and causing the multiplexor to select the residual voltage from the other analog to digital converter for the n'th cycle.

15. The apparatus according to claim 14, further comprising:
a deep learning accelerator comprising the multiple analog to digital converters having residual voltages coupled between individual ones of the multiple analog to digital converters, wherein there is a mapping from an analog to digital converter outputting a residual voltage to an analog to digital converter having the output residual voltage as an input.

16. The apparatus according to claim 15, wherein the multiple ones of the analog to digital converters are configured to perform computations in parallel.

17. The apparatus according to claim 15, wherein the multiple analog to digital converters are configured to perform time-interleaving using the multiple analog to digital converters at an operating rate to produce individual outputs, wherein the apparatus further comprises a multiplexor that creates a single output from the individual outputs, and wherein the single output has a processing rate faster than the operating rate.

* * * * *